United States Patent [19]
Manning

[11] Patent Number: 5,953,269
[45] Date of Patent: Sep. 14, 1999

[54] METHOD AND APPARATUS FOR REMAPPING ADDRESSES FOR REDUNDANCY

[75] Inventor: Troy Manning, Meridian, Id.

[73] Assignee: Micron Technology, Inc., Boise, Id.

[21] Appl. No.: 09/146,586

[22] Filed: Sep. 3, 1998

[51] Int. Cl.⁶ ............................................. G11C 7/00
[52] U.S. Cl. .................... 365/200; 365/201; 365/225.7
[58] Field of Search .................................. 365/200, 201, 365/96, 225.7, 230.03

[56] References Cited

U.S. PATENT DOCUMENTS

| | | | |
|---|---|---|---|
| 5,243,570 | 9/1993 | Saruwatari | 365/201 |
| 5,325,334 | 6/1994 | Roh et al. | 365/200 |
| 5,696,723 | 12/1997 | Tukahara | 365/200 |
| 5,706,231 | 1/1998 | Kokubo | 365/200 |
| 5,708,612 | 1/1998 | Abe | 365/200 |

*Primary Examiner*—David Nelms
*Assistant Examiner*—David Lam
*Attorney, Agent, or Firm*—Williams, Morgan & Amerson, P.C.

[57] ABSTRACT

A semiconductor memory device includes a memory array having first and second columns, each column having a plurality of memory locations associated therewith and being identified by first and second column addresses, respectively. Column address decoding circuitry receives column address signals and selects at least one column memory array. The column address decoding circuitry is programmable such that the first column is identified by the second column address and the second column may be identified by the first column address.

23 Claims, 5 Drawing Sheets

METHOD AND APPARATUS FOR REMAPPING ADDRESSES FOR REDUNDANCY

BACKGROUND OF THE INVENTION

1. Field of the Invention

This invention relates generally to the replacement of defective memory cells in a semiconductor memory, and, more particularly, to the replacement of defective memory cells having the same address within a portion of the semiconductor memory.

2. Description of the Related Art

A semiconductor memory device typically includes an array of memory cells, and the array is normally divided into a number of sub-arrays. Memory cells in the array are selected for reading and writing by means of row and column address signals input to the semiconductor memory device. The row and column address signals are processed by address decoding circuitry to select row lines and column lines in the array to access the desired memory cell or memory cells. A common practice in semiconductor memory devices is to implement the decoding at more than one level. For example, a first level decoding may yield data from a plurality of memory cells in the array, while a second level of decoding will select one memory cell, or a subset of memory cells, from the plurality. Thus, an address input to a semiconductor memory device will commonly result in the selection of a plurality of memory cells in the array or sub-array of the memory device, at least at a first level of decoding. That is, a plurality of memory cells will typically be selected by, or respond to, any particular address.

When semiconductor devices are manufactured, defective memory cells may occur in the memory array or in a sub-array. To salvage the semiconductor memory device despite these defective memory cells, and thus to increase overall yield in the manufacturing process, redundancy is commonly implemented. Redundant memory elements are located throughout the memory array, and each sub-array in the memory array will typically have associated with it a plurality of redundant memory elements. When a defective memory cell is detected in a sub-array, redundant decoding circuitry associated with the redundant memory elements for that sub-array may be programmed to respond to the address of the defective memory cell. When the address of the defective memory cell is input to the sub-array, the redundant memory element will respond in place of the defective memory cell. Redundancy and its implementation is known to those of ordinary skill in the art.

In many instances, a sub-array in a memory array will be further divided such that a given address applied to the sub-array will select a plurality of memory cells in that sub-array; that is, a plurality of memory cells in the sub-array will respond to a single address. Conventional redundancy circuitry and techniques may be used to replace a plurality of defective memory cells in the sub-array if each of the defective memory cells corresponds to a unique address. In that circumstance, each of the redundant decoders may be programmed with the address corresponding to one of the defective memory cells. However, if two or more of the defective memory cells in a sub-array respond to the same address, conventional redundancy circuitry and techniques may not be used because programming a redundant address decoder to respond to the address of interest will result in the redundant memory element associated with that redundant address decoder attempting to replace two distinct memory cells in the sub-array.

The present invention is directed to overcoming, or at least reducing the effects of, one or more of the problems set forth above.

SUMMARY OF THE INVENTION

In one aspect of the present invention, a semiconductor memory device comprises a memory array having at least first and second columns, with each column having a plurality of memory locations associated therewith. The first and second columns are identified by first and second column addresses, respectively. A column address decoding circuit is adapted to receive column address signals in response thereto, to select at least one column in the memory array. The column address decoding circuit is programmable such that the first column may be identified by the second column address and the second column may be identified by the first column address.

In another aspect of the present invention, a programmable address decoder for use in a semiconductor memory device comprises an address inverter circuit adapted to receive an address signal and a control signal and to produce as an output signal one of the address signal and a logical inversion of the address signal, as determined by the control signal. A decoder is coupled to the address inverter circuit and is adapted to receive the output signal from the address inverter circuit and to produce an output signal for selecting a memory location in the semiconductor array. A first memory location is selected if the control signal is in a first logical state and a second memory location is selected if the control signal is in a second logical state.

BRIEF DESCRIPTION OF THE DRAWINGS

The invention may be best understood by reference to the following description taken in conjunction with the accompanying drawings, in which like reference numerals identify like elements, and in which.

Figure 1:
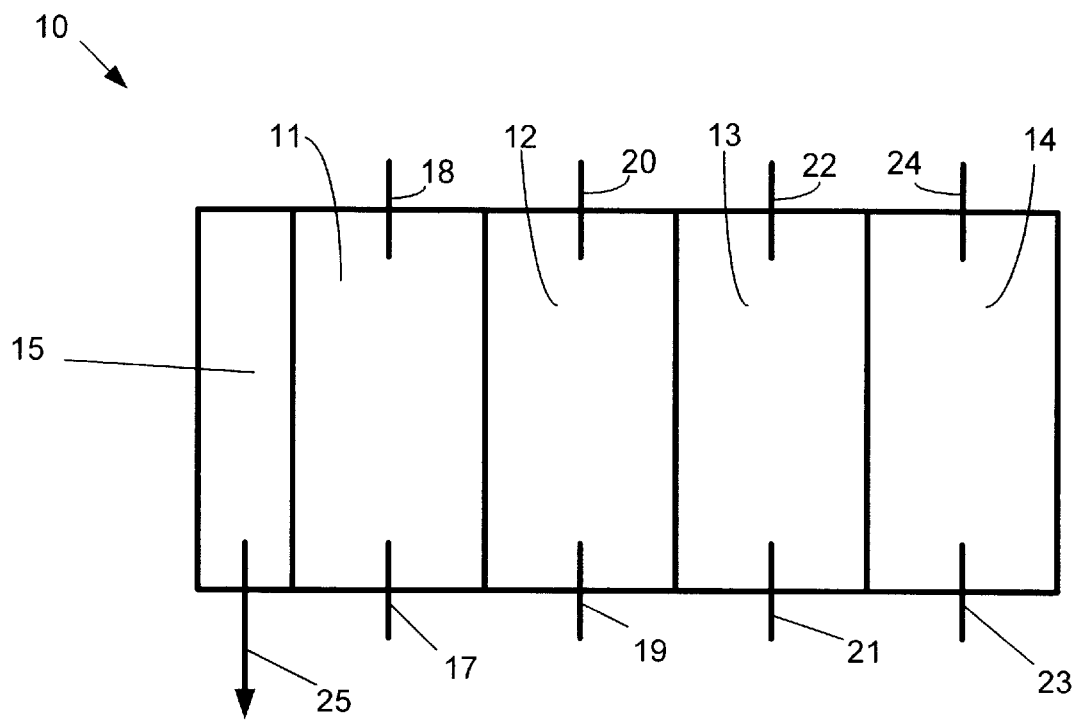
FIG. 1 illustrates a 256K memory sub-array that may utilize the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

FIG. 1 illustrates a 256k sub-array 10 that may be included in a semiconductor memory device. For example, a semiconductor memory of 128 megabits ($2^{27}$ bits) storage capacity may be divided into 512 sub-arrays of 256 Kbits ($2^{18}$ bits) each. The sub-array 10 is divided into four quadrants 11, 12, 13 and 14, each quadrant comprising 64K memory locations. Adjacent the 256K memory locations in the sub-array 10 is a redundant section 15 having eight redundant digit line pairs. By means of column decoding circuitry, which will be described in part below, data may be coupled out of memory cells in each of the quadrants 11, 12, 13 and 14 by input/output lines 17–24. In the particular sub-array 10 shown in FIG. 1, each quadrant yields two data bits out when the sub-array 10 is accessed. Quadrant 11 yields data bits on input/output lines 17 and 18, quadrant 12 yields data bits on input/output lines 19 and 20, quadrant 13 yields data bits on input/output lines 21 and 22, and quadrant 14 yields data bits on input/output lines 23 and 24. When one or more of the redundant digit line pairs in the redundant section 15 is utilized, data may be coupled out of memory cells in the redundant section 15 by means of a redundant input/output line 25. As will be appreciated by those of ordinary skill in the art, the redundant digit line pairs in the redundant section 15 may be used to replace digit line pairs in the four quadrants 11, 12, 13 and 14 that may have defective memory cells. Thus, by programming redundant column decoding circuitry (not shown) to respond to the address of a defective memory cell in a quadrant 11, 12, 13 or 14, a defective memory cell within a quadrant 11, 12, 13 or 14 may be replaced by a viable memory cell in the redundant section 15, and an otherwise unusable semiconductor memory device can be salvaged.

Figure 2:
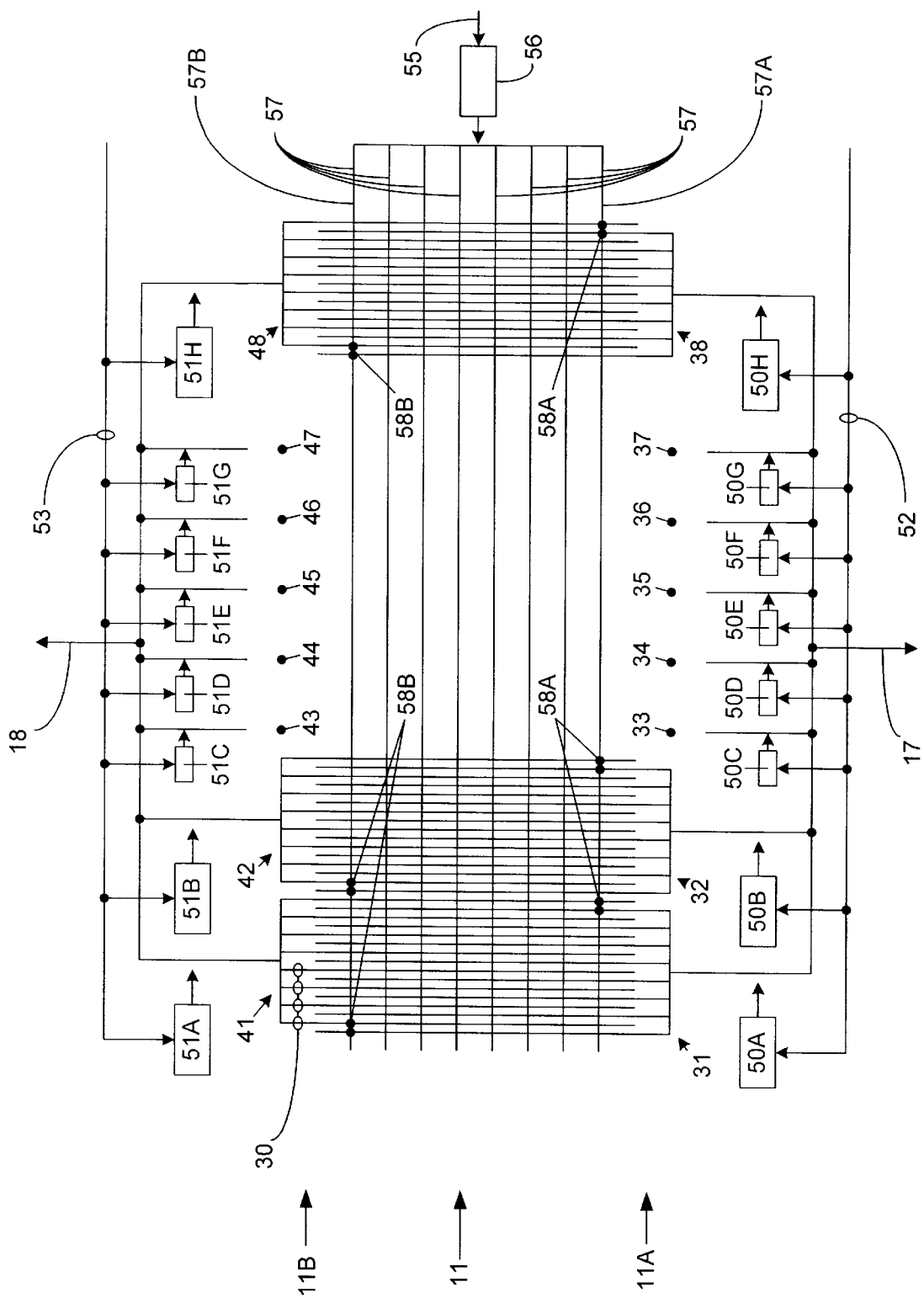
FIG. 2 illustrates one quadrant of the memory sub-array of FIG. 1.

FIG. 2 illustrates in greater detail one quadrant 11 of the sub-array 10 of FIG. 1. The quadrant 11 (and each of the quadrants 12, 13 and 14 in FIG. 1) includes 128 digit line pairs 30 arranged as 16 groups of eight digit line pairs 30 each. One half 11A of the quadrant 11 includes eight groups 31–38 of digit line pairs 30, each group 31–38 having eight digit line pairs 30. Another half 11B of the quadrant 11 includes eight groups 41–48 of digital line pairs 30, again each group 41–48 having eight digit line pairs 30. Each group 31–38 of digit line pairs 30 may be coupled, by means of column address decoding circuits 50A–50H, to its input/output line 17. For example, the group 31 may be coupled to the input/output line 17 under the control of the column address decoding circuit 50A, and the group 38 may be coupled to the input/output line 17 under the control of the column address decoding circuit 50H. Also, each group 41–48 of digit line pairs 30 may be coupled, by means of column address decoding circuits 51A–51H, to its input/output line 18. For example, the group 41 may be coupled to the input/output line 18 under the control of the column address decoding circuit 51A, and the group 48 may be coupled to the input/output line 18 under the control of the column address decoding circuit 51H. The column address decoding circuits 50A–50H receive column address signals by way of a line 52, and the column address decoding circuits 51A–51H receive column address signals by way of a line 53. In the particular embodiment described herein, the column address decoding circuits 50A–50H and 51A–51H receive column address signals A3, A4 and A5. However, as will be appreciated by those of ordinary skill in the art, different address signals and a different number of address signals may be substituted for the three address signals A3, A4 and A5. The column address decoding circuits 50A–50H and 51A–51H are programmable circuits and will be described in greater detail below.

The column decoding circuitry 56 also receives three column address signals, and, by conventional decoding techniques, selects one of eight column decode lines 57 for activation. When one of the eight column decode lines 57 is activated, it selects one digit line pair 30 from each of the 16 groups 31–38 and 41–48 of eight digit line pairs 30 in the quadrant 11. As illustrated in FIG. 2, the digit line pairs 30 are interleaved, and the activation of a single column decode line 57 will select eight digit line pairs 30 from each half 11A, 11B of the quadrant 11—one digit line pair 30 from each group 31–38 in half 11A, and one digit line pair 30 from each group 41–48 in half 11B. For example, when a column decode line 57A is activated, the first digit line pair 30 in each group 31–38 and 41–48, indicated at 58A, will be selected for reading or writing data. Or, when the column decode line 57B is activated, another digit line pair 30 in each group 31–38 and 41–48, indicated at 58B, will be selected for reading or writing data. In addition, as is well understood by those of ordinary skill in the art, row address decoding circuits (not shown) will activate a row line (not shown) in the quadrant 11 such that one memory cell coupled to each of the selected digit line pairs 30 may be accessed. Because the column address decoding circuits 56 and the column decode lines 57 select one digit line pair 30 from each group 31–38 and 41–48 of eight digit line pairs 30, and because the column address decoding circuits 50A–50H and 51A–51H select one group to be coupled to the input/output line 17 and one group to be coupled to the input/output line 18, each input/output line 17 and 18 carries a data signal from a single memory cell in the quadrant 11. The remaining three quadrants 12–14 of the sub-array 10 (see FIG. 1) each also yield data signals from two memory cells, and the total output from the sub-array 10 is eight data bits, one each by way of the input/output lines 17–24 (see FIG. 1).

Figure 3:
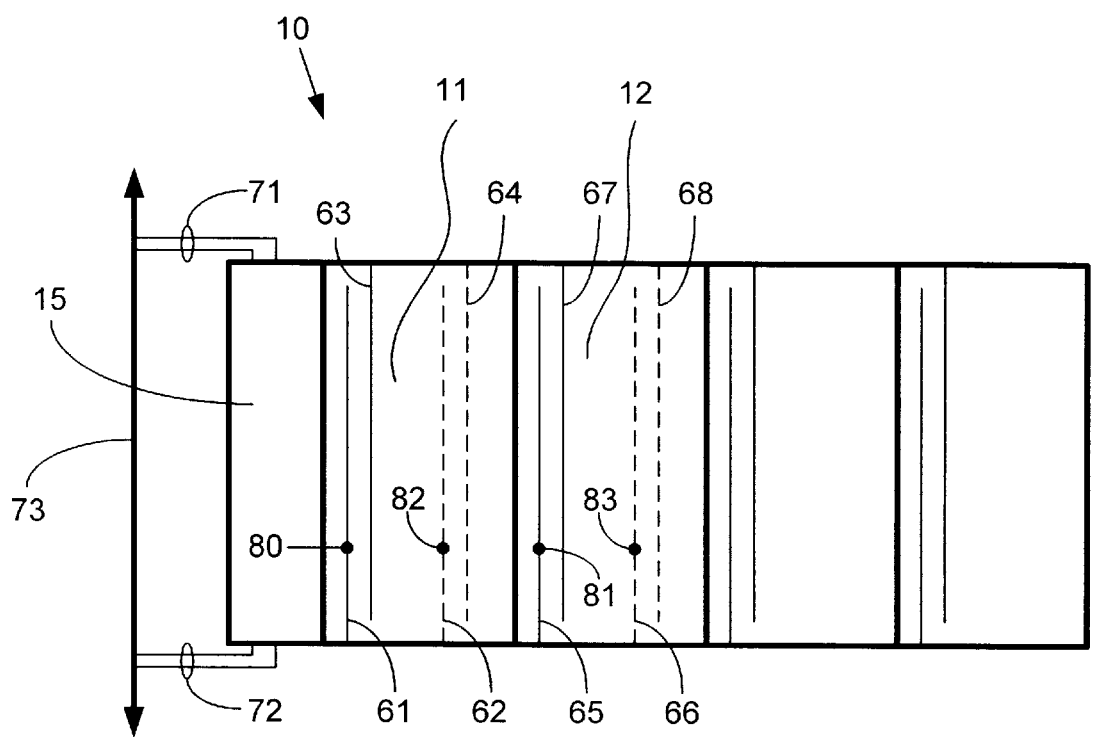
FIG. 3 illustrates the memory sub-array of FIG. 1 in which defective memory cells have been identified.

FIG. 3 shows the sub-array 10 of FIG. 1 in which two memory locations 80 and 81 have been identified as defective. In the sub-array 10 of FIG. 3, the defective memory locations 80 and 81 reside in the quadrants 11 and 12, respectively, and, moreover, the defective memory locations 80 and 81 reside at the same address. That is, in response to a particular address input to the decoding circuits for the sub-array 10, both defective memory locations 80 and 81 would be selected for reading or writing. In that circumstance, conventional repair techniques cannot be used to replace both defective memory locations 80 and 81.

FIG. 3 illustrates that the defective memory locations 80 and 81 reside on digit line pairs 61 and 65, respectively. As will be further illustrated in FIG. 4, the digit line pairs 61 and 65 are identically situated in their respective quadrants 11 and 12, meaning they reside in identical groups of eight digit line pairs 30 within their respective quadrants (see FIG. 2) and occupy identical positions within their respective groups. Thus, the digit line pairs 61 and 65 both respond to a single column address. Further, the defective memory locations 80 and 81 reside on the same row line such that when the row line is activated, both defective memory locations 80 and 81 are selected. To render the sub-array 10 repairable, the address of at least one of the defective memory locations 80 and 81 must be altered such that the defective memory locations 80 and 81 respond to different addresses. After changing the address associated with at least one of the defective memory locations 80 and 81, conventional repair circuits and techniques may be used to replace the defective memory locations 80 and 81 with viable memory cells from the redundant section 15. As an example, the column addresses associated with the digit line pairs 61 and 62 may be exchanged so that the addresses associated with the defective memory location 80 and a viable memory location 82 are exchanged. Therefore, the address for the digit line pair 61 is re-mapped to the digit line pair 62, and vice versa. As an end result, the new address for the defective memory location 80 will correspond to the address for a viable memory location 83 in the quadrant 12, and the address for the defective memory location 81 will correspond to the new address for the viable memory location 82 in the quadrant 11. Thus, the defective memory locations 80 and 81 are distinguishable by unique addresses, and each may be replaced with a viable memory location in the redundant section 15 using conventional circuits and techniques. That is, the defective memory location 80 may be replaced by a redundant element on the digit line pair 71, while the defective memory location 81 may be replaced by a redundant element on the digit line pair 72.

Figure 4:
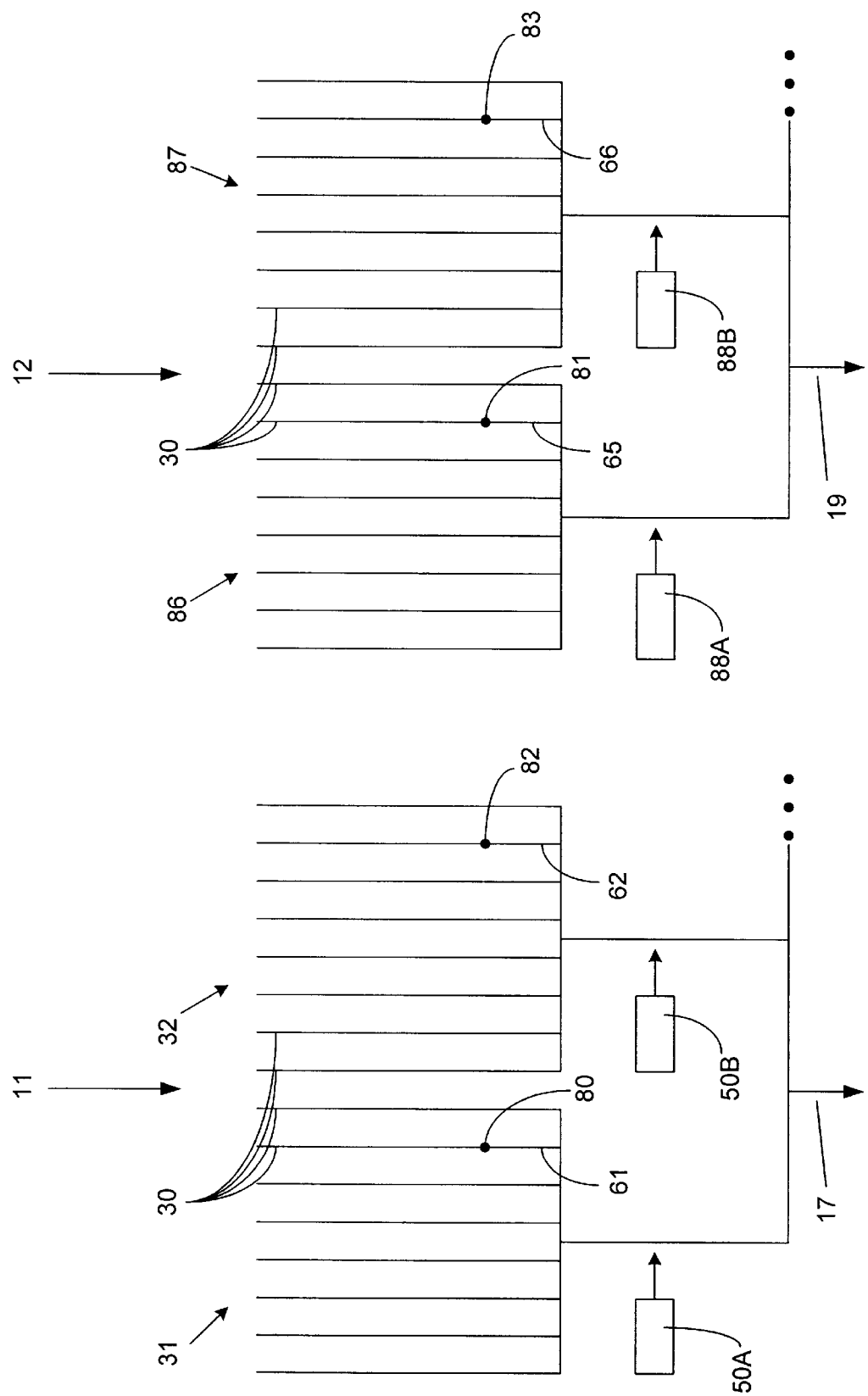
FIG. 4 illustrates portions of two quadrants of the memory sub-array of FIG. 1 in which the defective memory cells are shown.

FIG. 4 illustrates, in greater detail, the alteration of the column addresses between the two digit line pairs 61 and 62 shown in FIG. 3. FIG. 4 depicts two groups 31 and 32 of eight digit line pairs 30, each from the quadrant 11, and two groups 86 and 87 of eight digit line pairs 30, each from the quadrant 12. The groups 31 and 32 in the quadrant 11 correspond to the groups 86 and 87, respectively, in the quadrant 12. Thus, a column address that selects the digit line pair 61 in the group 31 will also select the digit line pair 65 in the group 86. Likewise, the column address that selects the digit line pair 62 in the group 32 will also select the digit line pair 66 in the group 87. As shown earlier in FIG. 3, defective memory locations 80 and 81 appear on the digit line pairs 61 and 65, respectively. The defective memory location 80 and the defective memory location 81 are located at the same address, and conventional column repair may not be used to successfully repair the semiconductor memory because programming a redundant element in the redundant section 15 (see FIG. 3) to respond to the address of the defective memory location 80 will result in the redundant element corresponding to the two different defective memory locations 80 and 81.

To repair both defective memory locations 80 and 81 using conventional column repair techniques, it is desirable to first change the address of at least one of the defective memory locations 80 and 81. To effect this change of address of at least one of the defective memory locations 80 and 81, the column addresses associated with the groups 31 and 32 may be exchanged, or re-mapped to one another. As an example of this re-mapping of the column addresses, the column address decoding for the quadrant 11 may be altered while leaving the column address decoding for the quadrants 12, 13 and 14 unaltered. In the example of FIG. 4, the decoding of the column addresses for the quadrant 11 effectively swaps the locations of the digit line pairs 30 in the group 31 with the digit line pairs 30 in the group 32. This swapping of the digit line pairs 30 in the groups 31 and 32 has the effect of relocating the defective memory location 80 from its original location on the digit line pair 61 to a new location 82 on the digit line pair 62 and relocating the viable memory location 82 from its original location on the digit line pair 62 to its new location 80 on the digit line pair 61. A column address that corresponds to the defective memory location 81 in the quadrant 12 will then correspond to the address of the viable memory location 86 in the quadrant 11. By the same token, the column address that corresponds to the viable memory location 83 in the quadrant 12 will also correspond to the address of the defective memory location 80 in the quadrant 11. Thus, the defective memory locations 80 and 81 will now be located at different addresses, and conventional replacement circuits and techniques may be utilized to repair both defective memory locations 80 and 81.

Figure 5:
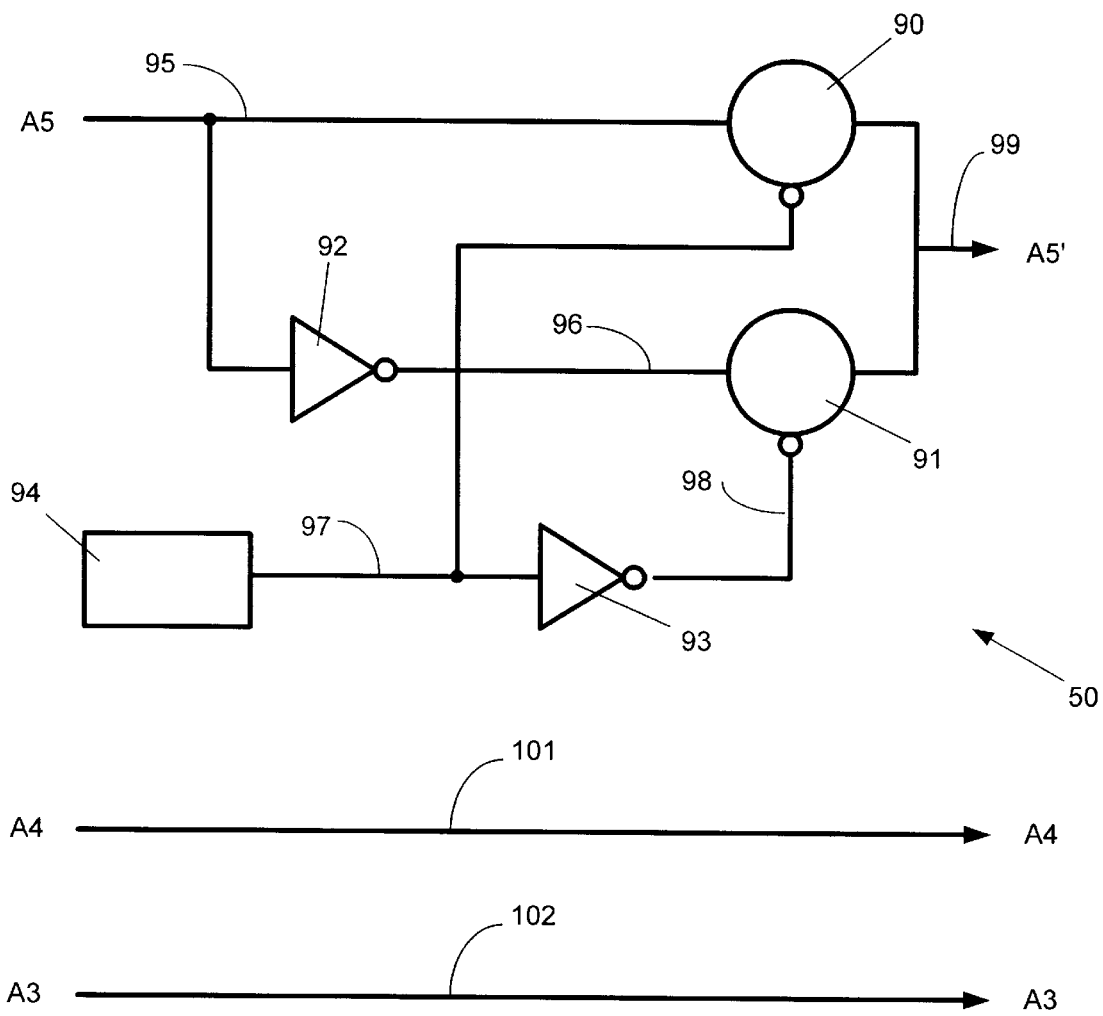
FIG. 5 shows one circuit useful in implementing the present invention.
Figure 6A:
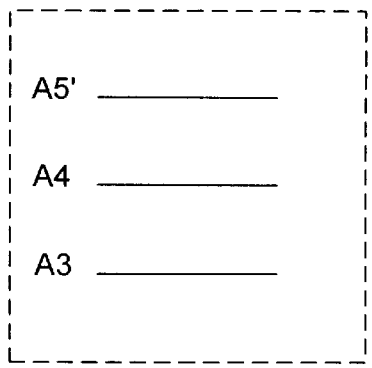
FIGS. 6A–6H show address decoder logic that may utilize the circuit of FIG. 5 in implementing the present invention.
Figure 6B:
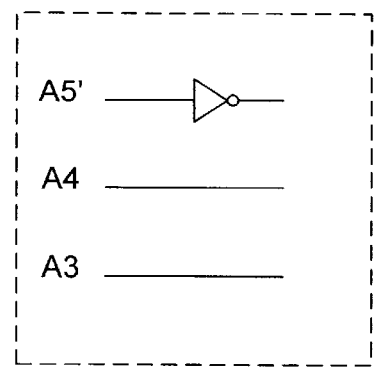
Figure 6C:
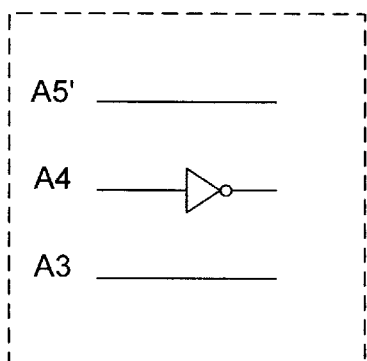
Figure 6D:
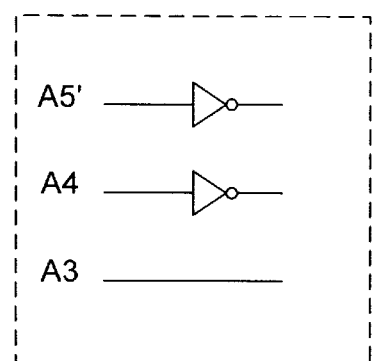
Figure 6E:
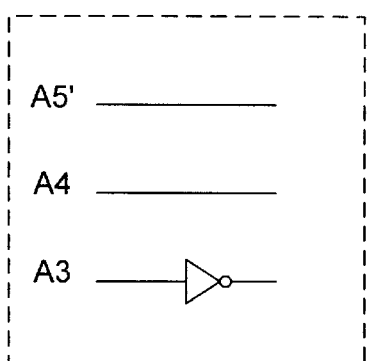
Figure 6F:
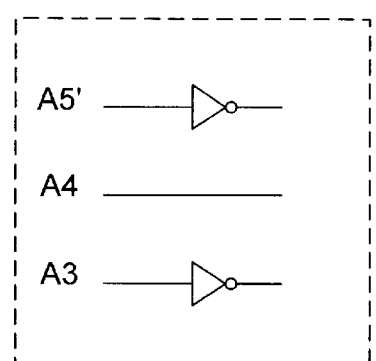
Figure 6G:
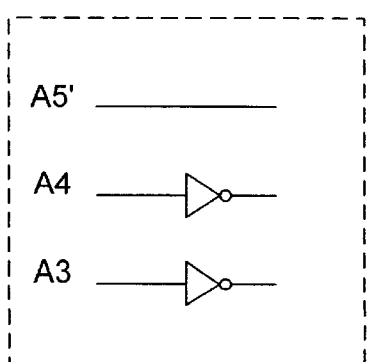
Figure 6H:
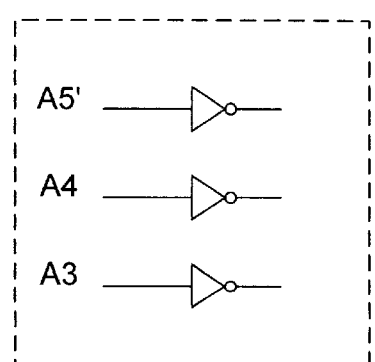

FIG. 5 shows one embodiment of a portion of a programmable column address decoder that may be used to implement the present invention. The programmable address decoder 50 includes multiplexers 90 and 91 and inverters 92 and 93. Address signal A5 is coupled to the multiplexer 90 and the inverter 92 by means of a line 95. The inverted form of the address signal A5 is coupled to the multiplexer 91 by means of a line 96. The signal A5' appears at the line 99 as the output of either the multiplexer 90 or the multiplexer 91. Under normal operation, the address signal A5 on the line 95 will appear at the line 99 as the output of the multiplexer 90. The inverted form of the address signal A5, appearing on the line 96 as the input to the multiplexer 91, will not appear at the output of the multiplexer 91. The multiplexers 90 and 91 are controlled, at least in part, by means of a fuse circuit 94 and the inverter 93. In normal operation, an output from the fuse circuit 94 appears at the line 97 and enables the multiplexer 90 to pass the address signal A5 from the line 95 to the line 99. At the same time, the output from the fuse circuit 94 appearing at the line 97 is inverted by the inverter 93, and the inverted signal appears at the line 98. The inverted form on the line 98 disables the multiplexer 91 from passing any signal appearing at the line 96. When an address is to be altered, the fuse circuit 94 will be altered such that the signal appearing on the line 97 will disable the multiplexer 90 and, through use of the inverter 93, enable the multiplexer 91. Under those circumstances, the inverted form of the address signal A5, which appears at the line 96 and is input to the multiplexer 91, will pass to the output of the multiplexer 91 to the line 99. Thus, the signal A5' appearing at the line 99 will be the inverted form of the address signal A5 appearing at the line 95. Also illustrated in FIG. 5 are two lines 101 and 102 that carry the address signals A4 and A3, respectively. The address signals A4 and A3 are not altered, as only one address signal need be altered to effect the re-mapping of column address signals sufficient for implementing the present invention. However, if desired, more than one address signal may be altered to effect re-mapping of the address signals to a sub-array or to a quadrant in a sub-array.

The circuit of FIG. 5, when used in conjunction with conventional decoding circuits, provides a means to alter the column addresses of the digit line pairs in the groups 31 and 32 of the quadrant half 11A (see FIG. 2), for example, relative to the digit line pairs 30 in the remaining groups 33–38 in the quadrant half 11A, relative to the digit line pairs 30 in the quadrant half 11B, and relative to the digit line pairs in the quadrants 12, 13 and 14. So, for example, referring again to FIG. 4, the column address decoding circuits 50A and 50B, each of which include the circuit of FIG. 5, may both be programmed by altering their respective fuse circuits 94, with the result that the decoding circuit 50A will respond to the column address formerly assigned to the decoding circuit 50B, and the decoding circuit 50B will respond to the column address formerly assigned to the decoding circuit 50A. Thus, the old defective memory location 80 will appear at the new viable memory location 82, and vice versa. The two defective memory locations 80 and 81 will then respond to different addresses, and conventional column repair techniques may be utilized to replace both defective locations 80 and 81.

In an alternative arrangement, the circuit of FIG. 5 may be interjected into the column address decoding circuits to re-map the column addresses for an entire half (for example, half 11A) of the quadrant 11. Referring to FIG. 2, the circuit of FIG. 5 may be coupled, for example, to the line 52 such that the output on the line 99 of the circuit of FIG. 5 will appear as the address signal A5 on the line 52 of FIG. 2. When implemented in this manner, all the groups 31–38 in the quadrant half 11A will respond to new address inputs, i.e., they will receive new column address designations. With this implementation, the column address association in the quadrant 11 will have been altered with respect to the column address association in the quadrant 12, and the defective memory locations 80 and 81 (FIG. 4) will again have different column address designations.

FIGS. 6A–6H illustrate the logic of eight column address decoders that may be used with the programmable circuit 50 of FIG. 5 in one implementation of the present invention. Each of the eight column address decoders may have a programmable circuit 50 coupled to its input; that is, eight programmable circuits 50 provide the signal A5' to the eight column address decoders—for example, the decoders 50A–50H of FIG. 2. Any two of the programmable circuits 50 for the decoders 50A–50H may then be programmed so that the two groups of interest, e.g., groups 41 and 42, served by those decoders "trade," or "swap," column addresses. As those of ordinary skill in the art will readily recognize, the specific decoding circuits used may take a variety of forms without departing from the spirit of the present invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor memory device, comprising:
   a memory array having at least first and second columns, each column having a plurality of memory locations associated therewith, the first and second columns being identified by first and second column addresses, respectively;
   a column address decoding circuit adapted to receive column address signals and, in response thereto, to select at least one column in the memory array; and
   the column address decoding circuit being programmable to identify the first column by the second column address and to identify the second column by the first column address.

2. The device of claim 1, further comprising:
   a redundant memory element; and
   a redundant decoder adapted to be programmed to respond to a predetermined address to select the redundant memory element.

3. The device of claim 1, wherein the column address decoding circuit comprises:
   a programmable device adapted to produce first and second control signals;
   wherein the first control signal causes the first and second columns to be identified by the first and second column addresses, respectively, and the second control signal causes the first and second columns to be identified by the second and first column addresses, respectively.

4. The device of claim 3, wherein the programmable device comprises a fuse.

5. The device of claim 3, wherein the first and second control signals comprise first and second levels of a single control signal.

6. A semiconductor device, comprising:
   a memory array having at least first and second columns, each column having a plurality of memory locations associated therewith, the first and second columns being identified by first and second column addresses, respectively;
   a column address decoder adapted to receive column address signals and, in response thereto, to select at least one column in the memory array; and
   an inverter circuit, coupled to an input of the column address decoder for controllably inverting an address signal before providing the address signal to the column address decoder;
   the inverter circuit being programmable such that the first and second columns are identified by the second and first column addresses, respectively.

7. The device of claim 6, wherein the inverter circuit comprises a programmable device adapted to produce a control signal to control the inverter circuit to provide an output signal that is one of the address signal and logical inversion of the address signal.

8. The device of claim 7, wherein the programmable device comprises a fuse.

9. The device of claim 7, wherein the inverter comprises a multiplexer circuit adapted to receive the address signal and a logical inversion of the address signal, and wherein the control signal controls the multiplexer circuit to provide an output signal that is one of the address signal and the logical inversion of the address signal.

10. A semiconductor memory device, comprising:
    a first memory sub-array having at least first and second columns, the first and second columns being identified by a common set of column address signals;
    first and second decoder circuits coupled to the first and second columns, respectively, and adapted to receive the common set of column address signals and, in response thereto, to select the first and second columns; and
    an address inverter circuit coupled to the first decoder circuit and adapted to selectably invert at least one address signal in the common set of column address signals;
    wherein, when the address inverter circuit inverts the at least one address signal, the first and second columns are identified by different sets of column address signals.

11. The device of claim 10, wherein the address inverter circuit comprises a multiplexer circuit adapted to receive the at least one address signal and a logical inversion of the at least one address signal and adapted to controllably produce as an output signal one of the at least one address signal and the logical inversion of the at least one address signal.

12. The device of claim 11, wherein the address inverter circuit further comprises a programmable circuit adapted to produce a control signal to control the multiplexer circuit.

13. The device of claim 12, wherein the programmable circuit comprises a fuse.

14. A programmable address decoder for use in a semiconductor memory device, comprising:

an address inverter circuit adapted to receive an address signal and a control signal and to produce as a first output signal one of the address signal and a logical inversion of the address signal, as determined by the control signal; and a decoder coupled to the address inverter circuit and adapted to receive the first output signal and to produce a second output signal for selecting a memory location in the semiconductor memory array;

wherein a first memory location is selected if the control signal is in a first logical state and a second memory location is selected if the control signal is in a second logical state.

15. The device of claim 14, further comprising a programmable device adapted to produce the control signal.

16. The device of claim 15, wherein the programmable device comprises a fuse.

17. The device of claim 14, wherein the address inverter circuit comprises a multiplexer circuit adapted to receive the address signal and a logical inversion of the address signal, and wherein the control signal controls the multiplexer circuit to produce as an output signal one of the address signal and the logical inversion of the address signal.

18. The device of claim 17, further comprising a programmable device adapted to produce the control signal.

19. The device of claim 18, wherein the programmable device comprises a fuse.

20. A method, comprising:

determining a first and second column, each column having a plurality of memory locations associated therewith, the first and second columns being identified by first and second column addresses, respectfully; and inverting a column address signal to identify the first and second columns by the second and first column addresses, respectively.

21. The method of claim 20, further comprising providing the address signal to a column address decoder.

22. The method of claim 20, wherein inverting the column address signal comprises multiplexing the column address signal and a logical inversion of the column address signal, and determining the logical state of the address signal using a control signal.

23. The method of claim 22, wherein multiplexing the column address signal and the logical inversion of the column address signal comprises programming a device adapted to produce the control signal.

* * * * *